United States Patent [19]

Barile et al.

[11] 4,060,427
[45] Nov. 29, 1977

[54] METHOD OF FORMING AN INTEGRATED CIRCUIT REGION THROUGH THE COMBINATION OF ION IMPLANTATION AND DIFFUSION STEPS

[75] Inventors: Conrad A. Barile, Wappingers Falls; Robert M. Brill, Fishkill; John L. Forneris, Lagrangeville; Joseph Regh, Wappingers Falls, all of N.Y.

[73] Assignee: IBM Corporation, Armonk, N.Y.

[21] Appl. No.: 673,314

[22] Filed: Apr. 5, 1976

[51] Int. Cl.² .................. H01L 21/265; H01L 21/324
[52] U.S. Cl. ...................................... 148/1.5; 29/579; 148/187; 156/653; 156/654; 357/91
[58] Field of Search ................... 148/1.5, 187; 357/91; 29/579; 156/644, 653, 654, 657

[56] References Cited

U.S. PATENT DOCUMENTS

| | | | |
|---|---|---|---|
| 3,615,874 | 10/1971 | Lepselter et al. | 148/1.5 |
| 3,669,760 | 6/1972 | Rein et al. | 148/1.5 |
| 3,717,790 | 2/1973 | Dalton et al. | 148/1.5 |
| 3,764,423 | 10/1973 | Hauser et al. | 156/653 |
| 3,908,262 | 9/1975 | Stein | 357/91 X |
| 3,947,866 | 3/1976 | Stellrecht | 148/1.5 X |

OTHER PUBLICATIONS

Oberai, "Combined Ion Implanted-Diffusion Emitter," IBM Tech. Discl. Bull., vol. 13, No. 10, Mar. 71, p. 2828.

Bratter et al., "Ion Implanted Emitter Process —etc.," IBM Tech. Discl. Bull., vol. 18, No. 6, Nov. 75, pp. 1827, 1828.

Primary Examiner—L. Dewayne Rutledge
Assistant Examiner—W. G. Saba
Attorney, Agent, or Firm—J. B. Kraft

[57] ABSTRACT

A region in an integrated circuit substrate is formed by first ion implanting impurities of a selected conductivity-determining type into a semiconductor substrate through at least one aperture in a masking electrically insulative layer, and then diffusing a conductivity-determining impurity of the same type through the same aperture into said substrate.

The method has particular application when the electrically insulative layer is a composite of two layers, e.g., a top layer of silicon nitride and a bottom layer of silicon dioxide and the aperture is thus a pair of registered openings respectively through said silicon nitride and silicon dioxide layers, and the aperture through the silicon dioxide layer has greater lateral dimensions than that in the silicon nitride layer to provide an undercut beneath the silicon nitride ion implantation barrier layer.

7 Claims, 8 Drawing Figures

METHOD OF FORMING AN INTEGRATED CIRCUIT REGION THROUGH THE COMBINATION OF ION IMPLANTATION AND DIFFUSION STEPS

BACKGROUND OF THE INVENTION

With the advance of integrated circuit fabrication technology, ion implantation is achieving increasing acceptance as an expedient for the introduction of the conductivity-determining impurities or dopants into a semiconductor substrate. For many applications, ion implantation has been substituted for the older and more conventional diffusion approach in the introduction of conductivity-determining impurities.

One of the primary advantages of ion implantation in the formation of active and passive regions in the semiconductor substrate is that it offers to the fabricator a higher degree of control of the lateral dimensions and the vertical concentration profiles of the introduced dopants.

The concentration profile is determined by the nature of the ion being implanted, the dosage and the energy level imparted to the ion by the ion implantation equipment. Lateral dimension of the ion implanted region in a substrate are generally determined by the dimensions of apertures in ion implantation barrier masks. Such barrier masks are customarily layers of electrically insulative material having such apertures formed therein. Unlike diffusion steps wherein the lateral borders of the regions of impurities introduced by diffusion extend beyond the lateral limits of the mask of the barrier mask apertures, in ion implantation, the lateral limits of the introduced regions are strictly defined by the aperture in the barrier mask and do not extend beyond the aperture periphery.

We have found that this latter characteristic while it serves to significant advantage in giving strict control of lateral dimensions in high device density integrated circuits, may present a problem where the contours of apertures in ion implantation barrier masks are such that lower portions of a given aperture have greater lateral dimensions than upper portions of the same aperture. In such a case the bottom portion of the aperture will extend laterally beyond the limit of the junction of the region formed by the ion implantation step since lateral limits will be strictly defined by the narrower upper portion of the opening. Such a structure could produce the undesirable effect of a PN junction exposed at the surface of the semiconductor substrate particularly when the electrically insulative layer which serves as the ion implantation barrier mask also serves the usual subsequent purpose of the passivation layer in the final integrated circuit structure.

This problem becomes quite pronounced if an electrical contact to the region formed by ion implantation is to be subsequently made through the deposition of metal into the same opening through which the conductivity-determining impurities were implanted. If there is an exposed PN junction in said opening the metal contact will short across such junction thereby rendering the contact and probably the device ineffective. Even if the metal deposited in the contact does not extend laterally to cover the junction, then the junction will remain exposed and unpassivated and will be subject to severe reduction of transistor gain (Beta).

SUMMARY OF THE PRESENT INVENTION

Accordingly, it is a primary object of the present invention to provide a method of ion implantation through a barrier mask having openings defining lateral dimensions of implanted regions wherein the problem of exposed lateral PN junctions is substantially eliminated.

It is another object of the present invention to provide a method of ion implantation through a mask of electrically insulative material having openings, the lower portions of which have greater lateral dimensions than the upper portions wherein the problem of exposed lateral PN junctions is substantially eliminated.

It is yet a further object of the present invention to provide a method forming region in an integrated circuit substrate by ion implantation through a mask of electrically insulative material which mask is a composite of two layers with that portion of mask apertures through the bottom layer having greater lateral dimensions than portions through the top layer wherein the problem of exposed PN junctions is minimized.

In accordance with the present invention, in fabrication of integrated circuits, the ion implantation into a semiconductor substrate is carried out as follows. A masking barrier layer of electrically insulative materials is formed over a surface of the substrate; the barrier layer has at least one aperture. An ion implantation is carried in the conventional manner to introduce a conductivity-determining impurity of a selected type through the aperture into the substrate. Then, a conductivity-determining impurity of the same selected type is diffused through the same aperture into the substrate. Since the diffused conductivity-determining impurities propagate both horizontally and vertically into the substrate, the diffusion insures that the PN junction of the region being introduced by the combination of steps will extend laterally beyond periphery of the opening through which the region is being formed.

Accordingly, when said aperture has a lower portion which has laterally greater dimension than any upper portion of the aperture, the possibility that the lateral PN junction of the region being formed will remain exposed within the aperture is substantially eliminated.

The method of the present invention is particualarly applicable to structures wheerin the ion implantation barrier mask is made up of two layers of different etchability rates, e.g., a lower layer of silicon dioxide and an upper layer of silicon nitride. Such a mask structure becomes desirable when the mask is subsequently to serve as the passivation layer since the silicon dioxide silicon nitride composite is a conventional passivation structure integrated circuits. In such conventional silicon dioxide silicon nitride masking structures the portion of the aperture through the bottom silicon dioxide layer has laterally greater dimensions than the aperture through the upper silicon nitride layer. Thus, during the implantation step, the narrower aperture through the silicon nitride layer serves to define the lateral dimensions of the ion implanted region of said selected conductivity type. However, the subsequent diffusion step utilizing the same conductivity type impurity assures that the lateral PN junction defining the region thus formed will extend beyond the periphery of the opening through the bottom layer and will not be exposed in the aperture.

The foregoing and other objects, features and advantages of the invention will be apparent from the following more particular description of the preferred embodiments of the invention, as illustrated in the accompanying drawings.

BRIEF DESCRIPTION OF THE DRAWINGS

FIGS. 1-4B are diagrammatic partial sections of a portion of an integrated circuit at various fabrication stages in order to illustrate the practice of the preferred embodiment of the present invention.

DESCRIPTION OF THE PREFERRED EMBODIMENTS

With reference to FIGS. 1-4B, there will now be described the background of the problem of ion implanting through an aperture or a composite of registered apertures having a lower portion with greater lateral dimensions than the upper portions of the aperture as well as the present solution for this problem. The specific embodiment will utilize an integrated circuit structure with a silicon dioxide-silicon nitride mask structure which will serve the dual function of the ultimate passivation layer over the surface of the integrated circuit as well as the ion implantation and diffusion barrier mask.

Figure 1:
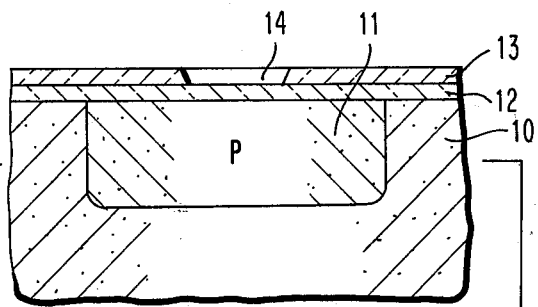
Figure 2:
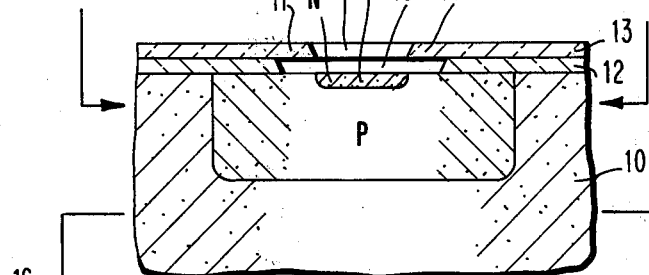

With reference to FIG. 1, to illustrate the present invention, the formation of an ion implanted emitter will now be described. The structure of FIG. 1 comprises P-type base region 11 having a surface concentration of about $10^{18}$ atoms/cm$^3$ of conventional P-type impurity is formed in an N-type epitaxial layer 10 having a maximum impurity concentration or doping level of about $10^{16}$ atoms/cm$^3$. The structure of FIG. 1 may be formed by conventional integrated circuit fabrication techniques such as that described in U.S. Pat. No. 3,539,876. The passivation layer on the surface of the structure comprises a layer of silicon dioxide 12 which may be formed by conventional thermal oxidation techniques or may be deposited by any conventional chemical vapor deposition or pyrolytic deposition technique. Silicon dioxide layer 12 has a thickness in the order of 800 A. The silicon nitride layer 13 has a thickness in the order of 1600 A and is deposited over the silicon dioxide layer. This silicon nitride layer can be formed by any conventional technique such as the chemical vapor deposition reaction of silane and ammonia. This reaction is normally carried out at a temperature in the order of 1,000° C. Alternatively, silicon nitride layer 13 may be deposited by conventional sputter deposition techniques. If an N-type emitter is to be formed within base region 11, conventional photolithographic etching techniques are utilized to open an opening 14 in silicon nitride layer 13. One conventional technique for etching opening 14 through the silicon nitride layer involves forming, by standard photoresist methods, a deposited silicon dioxide mask (not shown) over the silicon nitride layer defining openings 14 and etching with a suitable etchant for silicon nitride, such as hot phosphoric acid or hot phosphoric salt. The silicon dioxide mask, which is not shown, may then be removed leaving opening 14 as shown in FIG. 2.

Figure 1A:
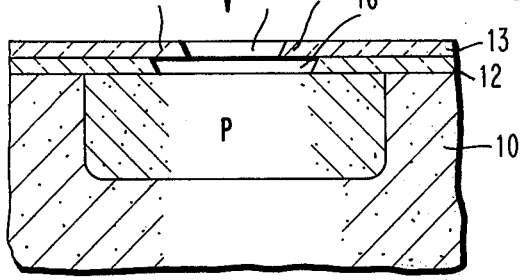
Figure 1B:
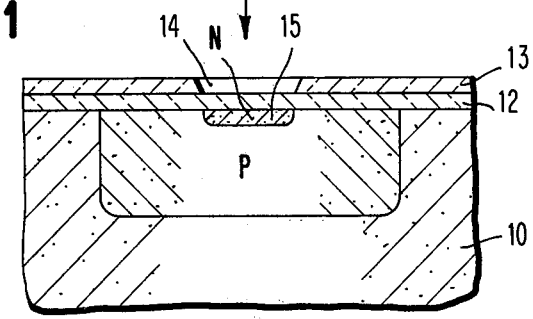

Then N-type conductivity-determining impurities may be introduced through silicon dioxide layer 12 to form ion implanted N-type emitter region 15, as shown in FIG. 1B, having a surface impurity concentration of $10^{21}$ atoms/cm$^3$. The portion of silicon dioxide layer 12 beneath opening 14 may be etched away to form opening 16, as shown in FIG. 1A and region 15 may then be formed by ion implantation directly into substrate 11 as shown in FIG. 2.

In the case where aperture 16 is formed prior to the ion implantation step, as shown in FIG. 1A, conventional photoresist techniques may be used to form such openings. A suitable etchant for the silicon dioxide is a conventional buffered hydrofluoric acid etch. In conventional techniques, this etching is continued for a period sufficient to extend the lateral dimension of opening 16 so as to undercut the silicon nitride layer 14 in regions 17.

For example, in the case of openings 14 through the silicon nitride layer 13 having dimensions in the order of two microns in diameter, the lateral extent of the undercut in region 17 will be in the order of 2500 A - 3000 A from the edge of opening 14 to produce the undercut structure shown in FIG. 1A.

Then, region 15 is formed by ion implantation directly into the surface of substrate 11. This region is formed by the introduction of arsenic ions $^{75}$As$^{30}$. The introduction is accomplished using conventional ion implantation equipment and techniques, as described, for example, in U.S. Pat. No. 3,756,862. The ion beam directed at the substrate has sufficient energy to penetrate the substrate to a depth in the order of 0.08 micron. However, it has insufficient energy to penetrate silicon nitride barrier layer or mask 13. In order to achieve such results, the dosage should be in the order of 7 $\times 10^{15}$ ions/cm$^2$ and the energy level of the equipment in the order of 40 Kev. Alternatively, the procedure of FIG. 1B may be followed, and the N region may be formed by implantation through silicon dioxide layer 12. If the implantation is to be made through layer 12, it desirably should have a thickness in the order of 100 A. In such a case, this thin portion layer 12 in the opening is preferably formed in a separate step. Alternatively, if layer 12 has a thickness of 800 A, it may be thinned to 100 A by conventional dip-etch techniques.

In any event, when following the procedure of FIG. 1B, since an emitter contact will eventually have to be formed to emitter region 15, opening 16 through silicon dioxide layer 12 will be then etched subsequent to the formation of implanted region 15 to provide the structure of FIG. 2. By this alternate route, opening 16 may be by any conventional method as previously described.

Therefore, in any case, since the limits of aperture 14 through silicon nitride layer 13 will define the lateral PN emitter junction 18, and because of the undercut in region 17, junction 18 will lie exposed within aperture 16. In this condition, even when the structure is heated for a conventional prior art emitter drive-in step, as shown in FIG. 3A, there remains a substantial risk that junction 18 will not be driven laterally for a distance sufficient so that it lies beneath silicon dioxide layer 12 but rather will remain exposed within opening 16 as shown in FIG. 3A. Even such a conventional emitter drive-in carried out at temperatures in the order of 1000° C for a period of 100 minutes will not insure that junction 18 will not remain exposed.

As a result, as shown in FIG. 4A, when a conventional metal contact such as contact 19 made of a standard integrated circuit contact metallurgy, such as aluminum or platinum, is deposited, there is a good possibility that it will extend across and thus short out emitter base junction 18 or the junction will remain undesirably impassivated.

Figure 3B:
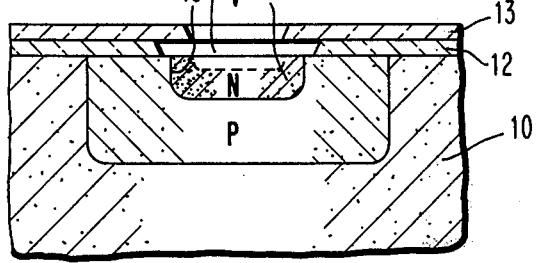
Figure 3B:
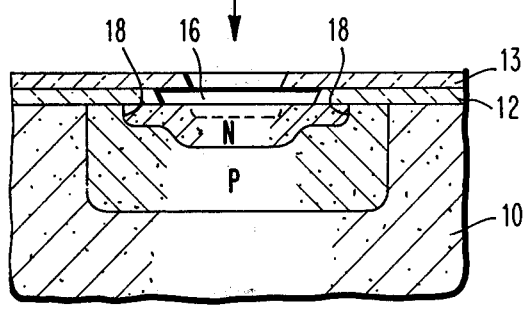

In accordance with the present invention as shown in FIG. 3B, the possibility of an exposed or shorted-out junction may be avoided by introducing an N-type impurity into the ambient during the drive-in step. For example, when the drive-in step to be carried out at a temperature in the order of 1,000° C for a time in the order of 100 minutes, a conventional N-type ambient dopant, for example, either $AsH_3$ or $PH_3$ is introduced into the ambient with standard vapor-phase doping levels. Since a metal contact is to be formed in the opening, this step must be carried out in an inert atmosphere such as argon or nitrogen in order that a thermal oxide will not be formed in the opening.

Figure 4B:
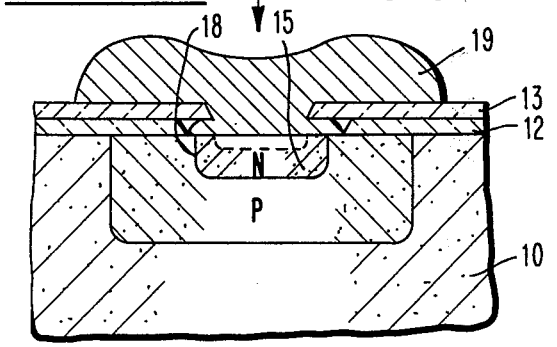
Figure 4B:
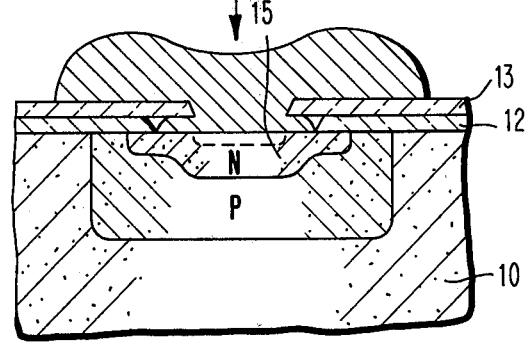

When such N-type impurities are introduced during the drive-in step, as shown in FIG. 3B, diffusion will take place initially from the periphery of openings 16, and junction 18 will be laterally extended beyond this periphery to insure that junction 18 is covered by silicon dioxide layer 12. With this structure, when metallic emitter contact 19 is subsequently deposited as shown in FIG. 4B, it will contact only emitter region 15 and will not short-out the junction. Also passivation of the junction is assured.

While the invention has been particularly shown and described with reference to the preferred embodiments thereof, it will be understood by those skilled in the art that various changes in form and details may be made therein without departing from the spirit and scope of the invention.

What is claimed is:

1. In the fabrication of integrated circuits, a method of ion implantation into a semiconductor substrate comprising forming a bottom layer of an electrically insulative material on a surface of said substrate, forming an upper layer of another electrically insulative material on said bottom layer, said upper layer being an ion implantation barrier and more etchable than said bottom layer in selected solvents and said bottom layer being more etchable than said upper layer in selected solvents, etching at least one aperture through said upper layer to expose said bottom layer, etching at least one aperture through said bottom layer to expose said surface, said aperture being in registration with and having greater lateral dimensions than said aperture in said upper layer thereby undercutting the upper layer at the periphery of said opening, ion implanting conductivity-determining impurities of a selected type through said registered apertures into said substrate whereby said opening in said upper layer defines the lateral dimensions of said implantation and the portions of said substrate exposed by said undercutting at the periphery of said opening remain unimplanted, and diffusing a conductivity-determining impurity of said selected type through said registered apertures in said substrate whereby said diffusion is made into said unimplanted peripheral portions of said exposed substrate and extends laterally beyond said periphery of the opening in the bottom layer.

2. The method of claim 1 wherein said substrate is silicon, said bottom layer is silicon dioxide and said upper layer is silicon nitride.

3. The method of claim 2 wherein said diffusion is carried out at a temperature of at least 1000° C whereby said implanted impurity is driven deeper into the substrate.

4. The method of claim 3 wherein said diffusion and drive-in step is carried out in an inert atmosphere.

5. The method of claim 1 wherein said impurities are N-type.

6. The method of claim 1 including the further step of depositing metal on said substrate surface through said registered apertures to form a substrate contact.

7. The method of claim 2 including the further step of depositing metal on said substrate surface through said registered apertures to form a substrate contact.

* * * * *

UNITED STATES PATENT AND TRADEMARK OFFICE
CERTIFICATE OF CORRECTION

PATENT NO. : 4,060,427
DATED : November 29, 1977
INVENTOR(S) : Conrad A. Barile et al It is certified that error appears in the above-identified patent and that said Letters Patent are hereby corrected as shown below:

Column 2, Line 46      delete "wheerin" and sub-
(In the Specification,      stitute therefor -- wherein --
Page 5, Line 4)

Column 4, Line 20      delete "$^{75}As^{30}$" and sub-
(In the Specification,      stitute therefore
Page 8, Line 17)      -- $^{75}As^{+}$ --

Signed and Sealed this

Sixteenth Day of May 1978

[SEAL]

Attest:

RUTH C. MASON      LUTRELLE F. PARKER
Attesting Officer      Acting Commissioner of Patents and Trademarks